United States Patent
Hsiao et al.

(10) Patent No.: US 8,964,393 B2
(45) Date of Patent: Feb. 24, 2015

(54) DISPLAY DEVICE

(71) Applicant: Shenzhen China Star Optoelectronics Technology Co., Ltd., Shenzhen, Guangdong (CN)

(72) Inventors: Yu-chun Hsiao, Shenzhen (CN); Quan Li, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 213 days.

(21) Appl. No.: 13/642,535

(22) PCT Filed: Sep. 26, 2012

(86) PCT No.: PCT/CN2012/081999
§ 371 (c)(1),
(2) Date: Oct. 21, 2012

(87) PCT Pub. No.: WO2014/043929
PCT Pub. Date: Mar. 27, 2014

(65) Prior Publication Data
US 2014/0078676 A1    Mar. 20, 2014

(30) Foreign Application Priority Data
Sep. 19, 2012    (CN) .......................... 2012 1 0349241

(51) Int. Cl.
*H05K 7/20*    (2006.01)
*G02F 1/00*    (2006.01)

(52) U.S. Cl.
CPC .............. *H05K 7/20963* (2013.01); *G02F 1/00* (2013.01)

USPC ...... 361/718; 361/679.54; 361/703; 361/704; 361/710; 361/719; 165/80.2; 165/80.3; 165/104.26; 165/104.33

(58) Field of Classification Search
USPC ............. 361/679.01, 679.21, 679.46, 679.54, 361/704–714, 724, 728, 736, 748, 749, 752, 361/831; 165/80.2, 80.3, 104.33, 122, 185; 313/11, 13, 14, 46, 582–587, 45, 48, 313/24, 44, 27, 494, 634; 349/58, 73, 121, 349/161, 61–65, 20, 32, 56, 59; 174/15.1, 174/16.1, 16.3, 252, 260; 348/836
See application file for complete search history.

(56) References Cited

U.S. PATENT DOCUMENTS

| | | | |
|---|---|---|---|
| 6,522,543 B2 * | 2/2003 | Kurihara et al. | 361/704 |
| 6,657,620 B2 * | 12/2003 | Oishi et al. | 345/204 |
| 6,774,872 B1 * | 8/2004 | Kawada et al. | 345/60 |
| 7,064,952 B1 * | 6/2006 | Chen et al. | 361/679.01 |
| 7,218,521 B2 * | 5/2007 | Kim | 361/704 |
| 7,251,140 B2 * | 7/2007 | Bae et al. | 361/719 |
| 7,254,031 B2 * | 8/2007 | Kim et al. | 361/717 |
| 7,262,968 B2 * | 8/2007 | Chang et al. | 361/704 |
| 7,345,878 B2 * | 3/2008 | Kim | 361/703 |
| 7,372,704 B2 * | 5/2008 | Jeong | 361/719 |
| 7,375,969 B2 * | 5/2008 | Jeong | 361/719 |

(Continued)

*Primary Examiner* — Michail V Datskovskiy
(74) *Attorney, Agent, or Firm* — Andrew C. Cheng

(57) ABSTRACT

The present invention provides a display device comprising a display panel, a driving chip and a heatsink. The driving chip is used to drive the display panel. The heatsink is thermally connected with the driving chip to dissipate the heat generated by the driving chip. Through the said method, the display device according to the present invention is provided with the heatsink connected with the driving chip to dissipate the heat generated by the driving chip, which improves the stability and reliability of the driving chip.

15 Claims, 4 Drawing Sheets

(56) References Cited

U.S. PATENT DOCUMENTS

| | | |
|---|---|---|
| 7,388,748 B2 * | 6/2008 | Shin ............................ 361/704 |
| 7,417,859 B2 * | 8/2008 | Bae et al. ..................... 361/710 |
| 7,495,918 B2 * | 2/2009 | Lee ............................. 361/707 |
| 7,508,673 B2 * | 3/2009 | Kim et al. .................... 361/704 |
| 7,660,105 B2 * | 2/2010 | Hwang ..................... 361/679.27 |
| 7,903,416 B2 * | 3/2011 | Chou ........................... 361/710 |

\* cited by examiner

DISPLAY DEVICE

BACKGROUND OF THE INVENTION

1. Field of the Invention

The present invention relates to the field of display, and in particular to a display device.

2. The Related Arts

With the development of science and technology, the display devices such as computers have become the necessary element in learning, working, and life of humans. Currently, the heat generated from the driving chip is not larger than from the light source (such as LED light source) in the display panel of the display device, so that there will not provide additional heatsink to dissipate the heat. However, after research by the applicant, the driving chip have temperature of 100-150 degree while working, which will influence the stability and reliability of the driving chip.

Therefore, it is necessary to provide a display device to solve the said problems.

SUMMARY OF THE INVENTION

The technical issue to be solved by the present invention is to provide a display device, which can dissipate the heat generated by the driving chip and improve the stability and reliability of the driving chip.

To solve the above technical issue, the present invention provides a display device, which comprises a display panel, a driving chip, a heatsink and a backlight module. The driving chip is used to drive the display panel. The heatsink is thermally connected with the driving chip to dissipate the heat generated by the driving chip. The backlight module comprises a rear plate. The heatsink further fixed on the rear plate and thermally connected with the rear plate. The heatsink comprises a body portion and two support portions. The two support portions are located at two ends of the body portion and separately fixed on the rear plate and supporting the body portion, which makes the body portion and the rear plate set with an interval. The driving chip is set on the side surface of the body portion against the rear plate, wherein the body portion and the two support portions are integrated structure.

Wherein, the body portion comprises a parallel portion and a first bending portion. The parallel portion is set parallel to the bottom of the rear plate. The first bending portion is connected with the outer edge of the parallel portion and extends obliquely toward the rear plate. The driving chip is set on the side surface of the first bending portion against the rear plate.

Wherein, the display device further comprises a front frame. The body portion further comprises a second bending portion. The second bending portion is connected with the first bending portion and extends away from the rear plate in a direction perpendicular to the bottom surface of the rear plate. The second bending portion further contacts with the inside of the front frame.

Wherein, the body portion further comprises a third bending portion. The third bending portion is connected with the inside of the parallel portion, and extends away from the rear plate in a direction perpendicular to the bottom surface of the rear plate.

To solve the above technical issue, the present invention provides a display device, which comprises a display panel, a driving chip, a heatsink and a front frame. The driving chip is used to drive the display panel. The heatsink is thermally connected with the driving chip to dissipate the heat generated by the driving chip. The front frame is provided with an opening. The heatsink is fixed on the front frame and thermally connected with the driving chip through the opening. Wherein, the heatsink comprises a body portion and a protrusion. The body portion is fixed on the front frame. The protrusion projects from the body portion and thermally be connected with the driving chip through the opening. Wherein, the body portion and the protrusion are integrated structure.

Wherein, the front frame is further provided with a concave portion at the periphery of the opening, the body portion is set inside the concave portion.

Wherein, the depth of the concave portion is provided to make the outer plane of the body portion and the outer plane of the front frame at the same level.

To solve the above technical issue, the present invention provides a display device, which comprises a display panel, a driving chip, and a heatsink. The driving chip is used to drive the display panel. The heatsink is thermally connected with the driving chip to dissipate the heat generated by the driving chip.

Wherein, the display device further comprises a backlight module. The backlight module comprises a rear plate. The heatsink is further fixed on the rear plate and thermally connected with the rear plate.

Wherein the heatsink comprises a body portion and two support portions. The two support portions are located at two ends of the body portion and separately fixed on the rear plate and supporting the body portion, which makes the body portion and the rear plate set with an interval, and the driving chip set on the side surface of the body portion against the rear plate.

Wherein, the body portion comprises a parallel portion and a first bending portion. The parallel portion is set parallel to the bottom of the rear plate. The first bending portion is connected with the outer edge of the parallel portion and extending obliquely toward the rear plate. The driving chip is set on the side surface of the first bending portion against the rear plate.

Wherein, the display device further comprises a front frame. The body portion further comprises a second bending portion. The second bending portion is connected with the first bending portion and extends away from the rear plate in a direction perpendicular to the bottom surface of the rear plate. The second bending portion further contacts with the inside of the front frame.

Wherein, the body portion further comprises a third bending portion. The third bending portion is connected with the inside of the parallel portion, and extends away from the rear plate in a direction perpendicular to the bottom surface of the rear plate.

Wherein, the display device further comprises a front frame. The front frame is provided with an opening. The heatsink is fixed on the front frame and thermally connected with the driving chip through the opening.

Wherein, the heatsink comprises a body portion and a protrusion. The body portion is fixed on the front frame. The protrusion projects from the body portion and is thermally connected with the driving chip through the opening.

Wherein, the front frame is further provided with a concave portion at the periphery of the opening. The body portion is set inside the concave portion.

Wherein, the depth of the concave portion is provided to make the outer plane of the body portion and the outer plane of the front frame at the same level.

The beneficial effects of the present invention is: unlike the case of the prior art, the display device according to the present invention is provided with the heatsink connected with the driving chip to dissipate the heat generated by the driving chip, which improves the stability and reliability of the driving chip.

DETAILED DESCRIPTION OF THE PREFERRED EMBODIMENTS

Figure 1:
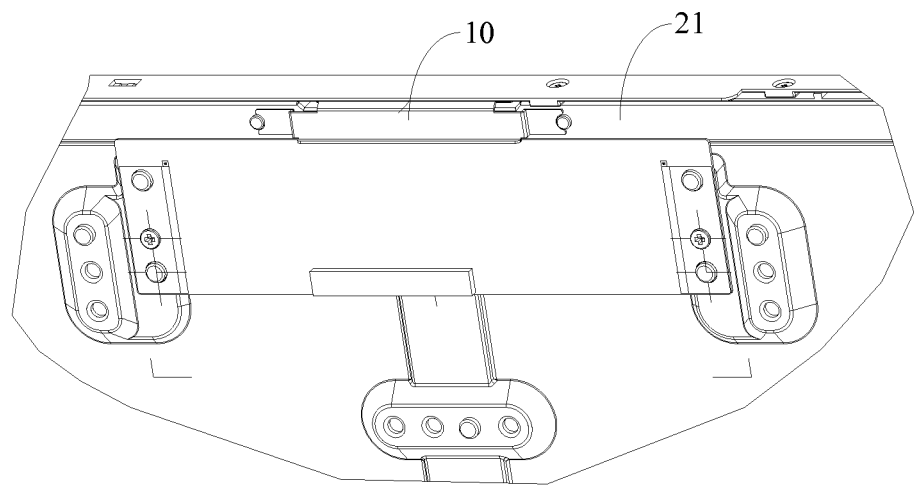
FIG. 1 is a schematic view illustrating the partial structure of the display device of the first embodiment according to the present invention.
Figure 2:
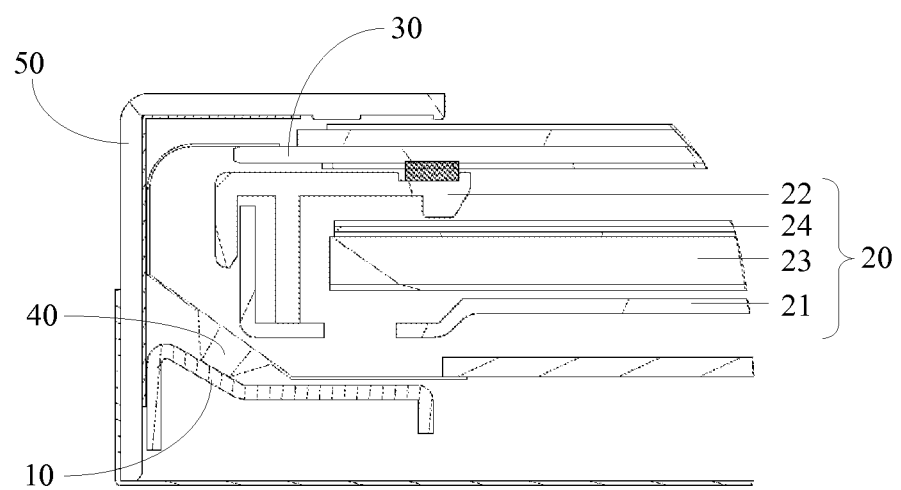
FIG. 2 is a schematic view illustrating cross-sectional structure of the display device of the first embodiment according to the present invention.

Referring to FIGS. 1 and 2, FIG. 1 is a schematic view illustrating the partial structure of the display device of the first embodiment according to the present invention, and FIG. 2 is a schematic view illustrating cross-sectional structure of the display device of the first embodiment according to the present invention. In the present embodiment, the display device comprises a heatsink 10, a backlight module 20, a display panel 30, a driving chip 40 and a front frame 50.

The driving chip 40 is used to drive the display panel 30. According to different circumstances, the driving chip 40 is set at the different position. Only one of the common setting modes of the driving chip 40 according to the present embodiment is selected to illustrate.

The heatsink 10 is thermally connected with the driving chip 40 to dissipate the heat generated by the driving chip 40. The backlight module 20 comprises a rear plate 21, which is used to co-operate with a middle frame 22 to accommodate a light source (not shown), a light guide plate 23, an optical film 24, and so on. In the present embodiment, the heatsink 10 is fixed on the rear plate 21 and thermally connected with the rear plate 21.

Figure 3:
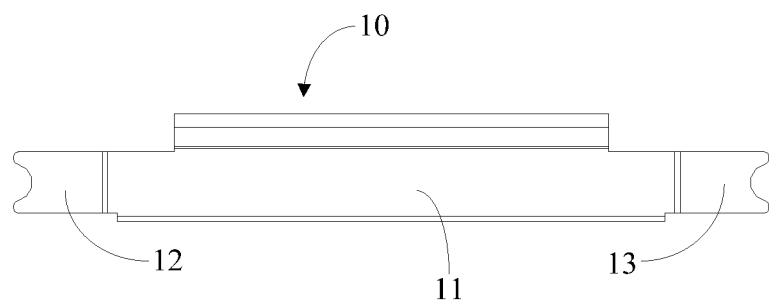
FIG. 3 is a top view of the heatsink shown in FIG. 1.
Figure 4:
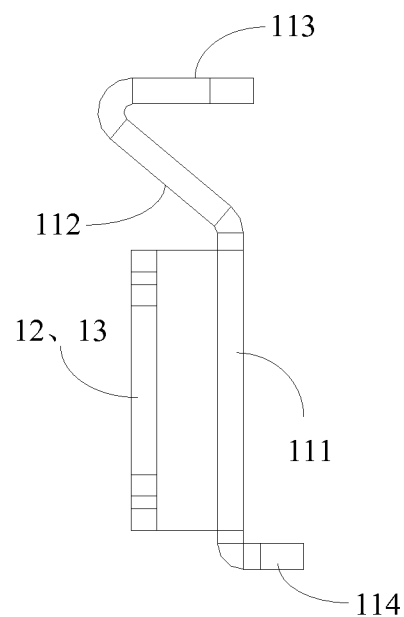
FIG. 4 is a side view of the heatsink shown in FIG. 1.

Referring to FIGS. 3 and 4, FIG. 3 is a top view of the heatsink 10 shown in FIG. 1, and FIG. 4 is a side view of the heatsink 10 shown in FIG. 1. In the present embodiment, the heatsink 10 comprises a body portion 11 and two support portions 12, 13.

The two support portions 12, 13 are located at two ends of the body portion 11 and separately fixed on the rear plate 21 and supporting the body portion 11, which makes the body portion 11 and the rear plate 21 set with an interval. The two support portions 12, 13 can be fixed and thermally connected with the rear plate 21 by double-sided adhesive which is preferred to be high-temperature double-sided adhesive. There can also be fixing holes provided on the two support portions 12, 13, and the mating fixing holes are provided at the corresponding position on the rear plate 21, which makes the two support portions 12, 13 be fixed and thermally connected with the rear plate 21 by screws or rivets.

The body portion 11 comprises a parallel portion 111, a first bending portion 112, a second bending portion 113, and a third bending portion 114. The parallel portion 111 is set parallel to the bottom of the rear plate 21. And the opposite sides of the parallel portion 111 are connected with the two support portions 12, 13. The first bending portion 112 is connected with the outer edge of the parallel portion 111 and extends obliquely toward the rear plate 21. The driving chip 40 is set on the side surface of the first bending portion 112 against the rear plate 21. The second bending portion 113 is connected with the first bending portion 112 and extends away from the rear plate 21 in a direction perpendicular to the bottom surface of the rear plate 21. The second bending portion 113 further contacts with the inside of the front frame 50. The third bending portion 114 is connected with the inside of the parallel portion 111, and extends away from the rear plate 21 in a direction perpendicular to the bottom surface of the rear plate 21. In a preferred embodiment, the body portion 11 and the two support portions 12, 13 are integrated structure.

The driving chip 40 is set on the side surface of the body portion 11 against the rear plate 21, which makes the heatsink 10 thermally connected with the rear plate 40. The heat generated from the driving chip 40 while working will be transferred to the body portion 11 by being thermally connected with the body portion 11 of the heatsink 10, and then further be diffused to the entire heatsink 10. The heatsink 10 is preferred to be metal heatsink. The surface of the heatsink 10 may be coated with thermal interface materials, such as heat radiation materials, to increase the heat dissipation effects.

Figure 5:
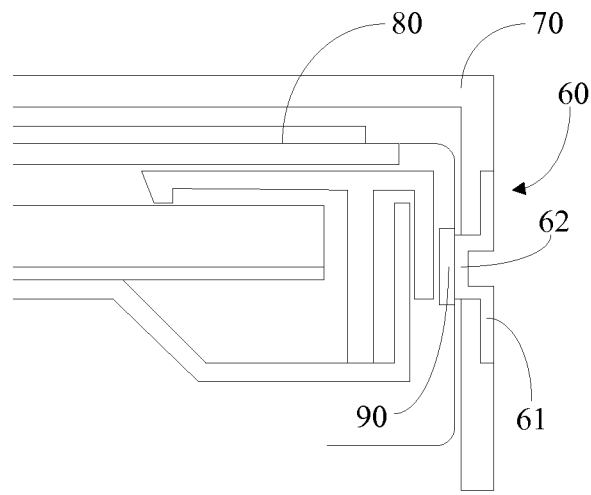
FIG. 5 is a schematic view illustrating the partial structure of the display device of the second embodiment according to the present invention.

Referring to FIG. 5, FIG. 5 is a schematic view illustrating the partial structure of the display device of the second embodiment according to the present invention. In the present embodiment, the display device comprises a heatsink 60, a backlight module 70, a display panel 80, and a driving chip 90. Wherein, the driving chip 90 is used to drive the display panel 80. The heatsink 60 is thermally connected with the driving chip 90 to dissipate the heat generated by the driving chip 90.

Figure 6:
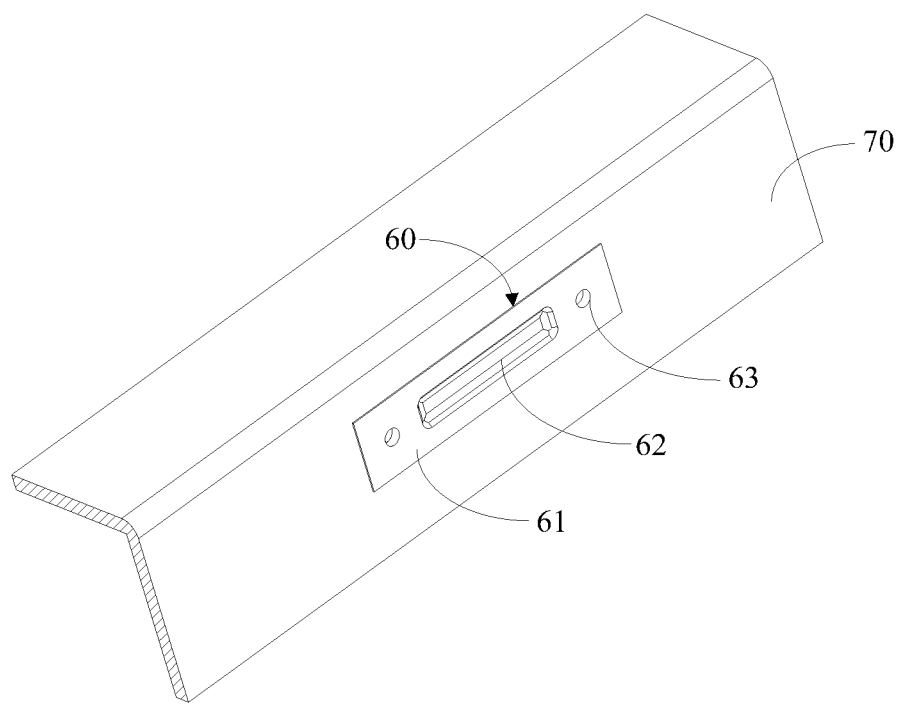
FIG. 6 is a schematic view illustrating the structure of the heatsink assembled with the front frame of the second embodiment according to the present invention.
Figure 7:
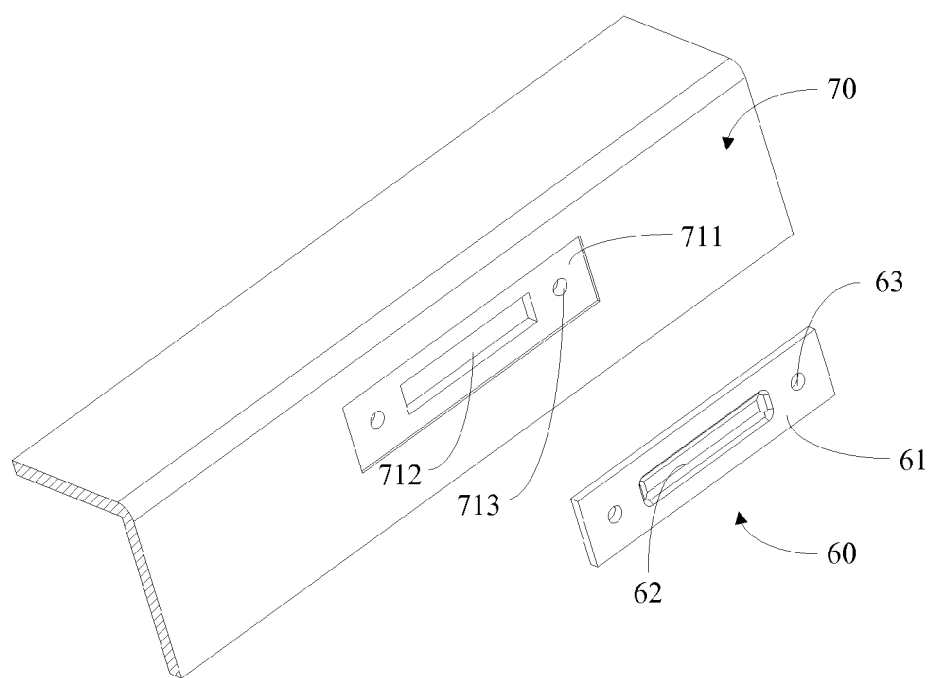
FIG. 7 is a schematic view illustrating the structure of the heatsink without the front frame of the second embodiment according to the present invention.

Further referring to FIGS. 6 and 7, FIG. 6 is a schematic view illustrating the structure of the heatsink 60 assembled with the front frame 70 of the second embodiment according to the present invention, and FIG. 7 is a schematic view illustrating the structure of the heatsink 60 without the front frame 70 of the second embodiment according to the present invention. The display device comprises a front frame 70. The heatsink 60 comprises a body portion 61, a protrusion 62 and a first fixing hole 63.

In the present embodiment, the front frame 70 is provided with an opening 712, a concave portion 711, and a second fixing hole 713. The concave portion 711 is set at the periphery of the opening 712. The second fixing hole 713 is set inside the concave portion 711. The body portion 61 is fixed on the front frame 70 and specifically inside the concave portion 711. The depth of the concave portion 711 is provided to make the outer plane of the body portion 61 and the outer plane of the front frame 70 at the same level. The protrusion 62 projects from the body portion 61 and thermally be connected with the driving chip 90 through the opening 712, which makes the heatsink 60 thermally be connected with the driving chip 90 through the opening 712. In a preferred embodiment, the body portion 61 and the protrusion 62 are integrated structure.

In the present embodiment, the first fixing hole 63 is set mating with the second hole 713. The display device further comprise a fastener (not shown) which is set inside the first fixing hole 63 and the second hole 713 to fix the heatsink 60 on the front frame 70. In the other embodiment, the heatsink 60 can also be fixed on the front frame 70 by coating double-sided adhesive on the body portion 61. The same with the said embodiment, the double-sided adhesive is preferred to be high-temperature double-sided adhesive. The heatsink 60 is preferred to be metal heatsink. The surface of the heatsink 10 may be coated with thermal interface materials, such as heat radiation materials, to increase the heat dissipation effects. In a preferred embodiment, the front frame 70 is made of plastic material.

Through the said method, the display device according to the present invention is provided with the heatsink connected with the driving chip to dissipate the heat generated by the driving chip, which improves the stability and reliability of the driving chip.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A display device, wherein the display device comprises:
    a display panel;
    a driving chip, which is used to drive the display panel;
    a heatsink, which is thermally connected with the driving chip to dissipate the heat generated by the driving chip;
    a backlight module, which comprises a rear plate, the heatsink further fixed on the rear plate and thermally connected with the rear plate;
    the heatsink comprising:
    a body portion;
    two support portions, which are located at two ends of the body portion and separately fixed on the rear plate and supporting the body portion, which makes the body portion and the rear plate set with an interval, and the driving chip set on the side surface of the body portion against the rear plate;
    wherein the body portion and the two support portions are integrated structure.

2. The display device as claimed in claim 1, wherein the body portion comprises:
    a parallel portion, which is set parallel to the bottom of the rear plate;
    a first bending portion, which is connected with the outer edge of the parallel portion and extending obliquely toward the rear plate, the driving chip set on the side surface of the first bending portion against the rear plate.

3. The display device as claimed in claim 2, wherein the display device further comprises a front frame, the body portion further comprises a second bending portion, the second bending portion is connected with the first bending portion and extends away from the rear plate in a direction perpendicular to the bottom surface of the rear plate, the second bending portion further contacts with the inside of the front frame.

4. The display device as claimed in claim 3, wherein the body portion further comprises a third bending portion, the third bending portion is connected with the inside of the parallel portion, and extends away from the rear plate in a direction perpendicular to the bottom surface of the rear plate.

5. A display device, wherein the display device comprises:
    a display panel;
    a driving chip, which is used to drive the display panel;
    a heatsink, which is thermally connected with the driving chip to dissipate the heat generated by the driving chip;
    a front frame, which is provided with an opening, the heatsink fixed on the front frame and thermally connected with the driving chip through the opening;
    the heatsink comprising:
    a body portion, which is fixed on the front frame;
    a protrusion, which projects from the body portion and thermally connected with the driving chip through the opening;
    wherein the body portion and the protrusion are integrated structure.

6. The display device as claimed in claim 5, wherein the front frame is further provided with a concave portion at the periphery of the opening, the body portion is set inside the concave portion.

7. The display device as claimed in claim 6, wherein the depth of the concave portion is provided to make the outer plane of the body portion and the outer plane of the front frame at the same level.

8. A display device, wherein the display device comprises:
    a display panel;
    a driving chip, which is used to drive the display panel;
    a heatsink, which is thermally connected with the driving chip to dissipate the heat generated by the driving chip;
    a backlight module, which comprises a rear plate, the heatsink being further fixed on the rear plate and thermally connected with the rear plate; and
    a front frame, which is provided with an opening, the heatsink being fixed on the front frame and thermally connected with the driving chip through the opening.

9. The display device as claimed in claim 8, wherein the heatsink comprises:
    a body portion;
    two support portions, which are located at two ends of the body portion and separately fixed on the rear plate and supporting the body portion, which makes the body portion and the rear plate set with an interval, and the driving chip set on the side surface of the body portion against the rear plate.

10. The display device as claimed in claim 9, wherein the body portion comprises:
    a parallel portion, which is set parallel to the bottom of the rear plate;
    a first bending portion, which is connected with the outer edge of the parallel portion and extending obliquely toward the rear plate, the driving chip set on the side surface of the first bending portion against the rear plate.

11. The display device as claimed in claim 10, wherein the body portion further comprises a second bending portion, the second bending portion is connected with the first bending portion and extends away from the rear plate in a direction perpendicular to the bottom surface of the rear plate, the second bending portion further contacts with the inside of the front frame.

12. The display device as claimed in claim 11, wherein the body portion further comprises a third bending portion, the third bending portion is connected with the inside of the parallel portion, and extends away from the rear plate in a direction perpendicular to the bottom surface of the rear plate.

13. The display device as claimed in claim 8, wherein the heatsink comprises:
    a body portion, which is fixed on the front frame;
    a protrusion, which projects from the body portion and thermally connected with the driving chip through the opening.

14. The display device as claimed in claim 13, wherein the front frame is further provided with a concave portion at the periphery of the opening, the body portion is set inside the concave portion.

15. The display device as claimed in claim 14, wherein the depth of the concave portion is provided to make the outer plane of the body portion and the outer plane of the front frame at the same level.

* * * * *